United States Patent
Paek et al.

(10) Patent No.: US 8,908,795 B2
(45) Date of Patent: Dec. 9, 2014

(54) APPARATUS AND METHOD FOR CALIBRATION OF SUPPLY MODULATION IN TRANSMITTER

(71) Applicant: Samsung Electronics Co. Ltd., Suwon-si, Gyeonggi-do (KR)

(72) Inventors: Ji-Seon Paek, Suwon-si (KR); Hee-Sang Noh, Yongin-si (KR); Hyung-Sun Lim, Suwon-si (KR); Dong-Ki Kim, Seoul (KR); Jun-Seok Yang, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 16 days.

(21) Appl. No.: 13/651,749

(22) Filed: Oct. 15, 2012

(65) Prior Publication Data

US 2013/0094553 A1 Apr. 18, 2013

(30) Foreign Application Priority Data

Oct. 14, 2011 (KR) .................. 10-2011-0105567

(51) Int. Cl.
*H04L 25/03* (2006.01)
*H03F 3/24* (2006.01)
*H03F 1/02* (2006.01)
*H03F 1/32* (2006.01)
*H03F 3/217* (2006.01)

(52) U.S. Cl.
CPC ............... *H03F 1/32* (2013.01); *H03F 3/245* (2013.01); *H03F 1/0222* (2013.01); *H03F 2200/432* (2013.01); *H03F 3/217* (2013.01)
USPC ........... 375/296; 375/295; 375/297; 375/259; 375/285

(58) Field of Classification Search
CPC ............ H04B 17/0005; H04B 17/001; H04B 17/0012; H04B 17/003; H04B 17/0027; H04B 17/0022; H04B 17/0017; H03F 1/02; H03F 1/0211; H03F 1/0205; H03F 1/0222; H03F 1/0227; H03F 1/0238; H03F 1/26; H03F 1/30
USPC .................. 375/295, 296, 297, 259, 260, 285
See application file for complete search history.

(56) References Cited

U.S. PATENT DOCUMENTS 6,437,641 B1 * 8/2002 Bar-David ...................... 330/10
7,276,966 B1 * 10/2007 Tham et al. .................... 330/136

(Continued)

OTHER PUBLICATIONS

P.Y.W. et al. 'A Two-Phase Switching Hybrid Supply Modulator for RF Power Amplifiers With 9 percent Efficiency Improvement', In: IEEE Journal of Solid-State Circuits, Vol. 45, No. 12, Dec. 2010, pp. 2543-2556.

(Continued)

*Primary Examiner* — Siu Lee
(74) *Attorney, Agent, or Firm* — Jefferson IP Law, LLP

(57) ABSTRACT

A transmit apparatus having a supply modulator is provided. The apparatus includes a detector and the supply modulator. In the method, the detector detects an output signal of the supply modulator. Also, the supply modulator receives the detected output signal of the supply modulator from the detector and calibrates a modulation characteristic of the supply modulator. The transmit apparatus having a supply modulator includes a modulator/demodulator (modem) and the supply modulator. The modem provides a calibration signal for calibrating a modulation characteristic of the supply modulator, to the supply modulator. The supply modulator outputs a modulated signal in accordance with the calibrated modulation characteristic of the supply modulator based on the calibration signal from the modem.

42 Claims, 10 Drawing Sheets

(56) References Cited

U.S. PATENT DOCUMENTS

| | | | |
|---|---|---|---|
| 8,050,351 B2* | 11/2011 | Cho et al. | 375/295 |
| 2002/0090921 A1* | 7/2002 | Midtgaard et al. | 455/126 |
| 2006/0022751 A1 | 2/2006 | Fuller et al. | |
| 2008/0285682 A1* | 11/2008 | Chu et al. | 375/298 |
| 2009/0004981 A1 | 1/2009 | Eliezer et al. | |
| 2009/0052572 A1* | 2/2009 | McHenry | 375/295 |
| 2012/0021695 A1* | 1/2012 | Murji | 455/73 |
| 2012/0139635 A1* | 6/2012 | Ho et al. | 330/278 |

OTHER PUBLICATIONS

J.C. et al. 'A Polar Transmitter With CMOS Programmable Hysteretic-Controlled Hybrid Switching Supply Modulator for Multistandard Applications', In: IEEE Transactions on Microwave Theory and Techniques, Vol. 57, No. 7, Jul. 200 , pp. 1675-1686.

J.S.W. et al. 'A Class-G Supply Modulator and Class-E PA in 130 nm CMOS', In : IEEE Journal of Solid-State Circuits, Vol. 44, No. 9, Sep. 2009, pp. 2339-2347.

T.W.K. et al. 'A 2 W CMOS Hybrid Switching Amplitude Modulator for Edge Polar Transmitters', In: IEEE Journal of Solid-State Circuits, Vol. 42, No. 12, Dec. 2007, pp. 2666-2676.

International Written Opinion issued Feb. 7, 2013 in International Application No. PCT/KR2012/008193.

* cited by examiner

APPARATUS AND METHOD FOR CALIBRATION OF SUPPLY MODULATION IN TRANSMITTER

PRIORITY

This application claims the benefit under 35 U.S.C. §119(a) to a Korean patent application filed on Oct. 14, 2011 in the Korean Intellectual Property Office and assigned Serial No. 10-2011-0105567, the entire disclosure of which is hereby incorporated by reference.

BACKGROUND OF THE INVENTION

1. Field of the Invention

The present invention relates to a power amplifier of a radio transmitter. More particularly, the present invention relates to a technology of calibrating the characteristic of a linear amplifying stage of a hybrid supply modulator that modulates a supply voltage of a power amplifier of a radio transmitter.

2. Description of the Related Art

For the sake of long battery use time for a wireless mobile communication terminal a power management integrated circuit and a method for efficiency enhancement of a wireless power amplifier is desired. In a Wireless Broadband (WiBro) system and a Long Term Evolution (LTE) system, a wireless mobile communication terminal uses a technology for obtaining a characteristic of high efficiency despite a characteristic of high Peak-to-Average Power Ratio (PAPR). An exemplary technology corresponding to this is an Envelope Tracking (ET) or Envelope Elimination and Restoration (EER) technology. The ET or EER technology varies a supply voltage of a Radio Frequency (RF) power amplifier in accordance with the output power of the RF power amplifier and operates the RF power amplifier in a saturated region or switching region to have both a high linearity and a high efficiency characteristic. Particularly, despite a modulated signal having a high PAPR, an RF linear amplifier can have a high efficiency.

FIG. 1 illustrates a power amplifier architecture according to the related art.

Referring to FIG. 1, a modulator/demodulator (modem) 100 processes a baseband signal in accordance with a corresponding communication scheme (e.g., an Orthogonal Frequency Division Multiplexing/Orthogonal Frequency Division Multiple Access (OFDM/OFDMA) communication scheme or a Code Division Multiple Access (CDMA) communication scheme) and outputs the baseband signal to a Radio Frequency (RF) module 102. Also, the modem 100 provides an envelope component of the baseband signal to a supply modulator 106. The RF module 102 converts the received baseband signal into an RF signal, and outputs the RF signal to an RF power amplifier 104.

The supply modulator 106 modulates a Direct Current (DC) source (e.g., battery power) in accordance with an envelope signal provided from the modem 100, and outputs an Alternating Current (AC) source to the RF power amplifier 104. An output signal of the supply modulator 106 is used as a voltage source, and has optimal linearity and efficiency.

The RF power amplifier 104 amplifies an RF signal depending on an output signal of the supply modulator 106, and outputs the amplified RF signal through an antenna. By using the ET technique or EER technique, the RF power amplifier 104 can amplify the RF signal depending on the output signal of the supply modulator 106.

FIG. 2 illustrates a power amplifier architecture using a hybrid supply modulator according to the related art.

Referring to FIG. 2, a modem 200, an RF module 202, and an RF power amplifier 205 are the same as the modem 100, the RF module 102, and the RF power amplifier 104 of FIG. 1 and thus, a detailed description thereof is omitted herein.

The RF power amplifier 205 of FIG. 2 uses the hybrid supply modulator, which is composed of a linear amplifying stage and a switching amplifying stage. The majority of the current supplied to the RF power amplifier 205 is supplied from the switching amplifying stage of the hybrid supply modulator. The linear amplifying stage pushes and pulls compensating currents so as to compensate for a linear distortion, which is caused by a ripple characteristic included in an output signal (hereinafter, referred to as 'switching currents') of the switching amplifying stage when the switching currents pass through an inductor 212. In other words, when the output signal of the switching amplifying stage is low, the linear amplifying stage pushes current to the output signal of the switching amplifying stage and, when the output signal of the switching amplifying stage is high, the linear amplifying stage pulls current from the output signal of the switching amplifying stage. As the architecture of the switching amplifying stage of the hybrid supply modulator, it generally uses a buck converter.

The linear amplifying stage maintains a desired gain characteristic of an output voltage of the hybrid supply modulator versus an input envelope signal thereof, and has a feedback loop for amplification and power conversion. By means of a feedback signal, the linear amplifying stage performs comparison between an output signal of the linear amplifying stage and the input envelope signal thereof and compensates for the non-linearity of the switching amplifying stage.

Generally, the linear amplifying stage includes feedback resistors 208 and 210 and a linear amplifier 214.

The switching amplifying stage includes a comparator 216 for generating a switching signal and a switching amplifier 218 for amplifying the switching signal.

The linear amplifier 214 includes an Operational Transconductance Amplifier (OTA) input stage (or OA amp) (not shown) having a high gain, a class-AB bias stage (not shown), a push-pull output stage (not shown), and a stability compensation feedback Resistor (R) and Capacitor (C). On the other hand, the linear amplifier 214 includes an output current sensing stage for sensing currents of the push-pull output stage and generating a switching signal for driving the switching amplifying stage.

The OTA input stage having a high gain characteristic generates a control signal for controlling to make an input reference signal and an output voltage identical with each other. The class-AB bias stage enhances an efficiency characteristic of the push-pull output stage and supplies a bias to have a desired linear characteristic. The push-pull output stage outputs a current component of a high frequency domain that the switching amplifying stage fails to provide sufficiently. Accordingly, a transistor level of the push-pull output stage is determined based on a maximum value upon design. However, the maximum level of the push-pull output stage causes a big parasitic capacitance, deteriorating a BandWidth (BW) characteristic of the linear amplifying stage. Also, the linear amplifier 214 requires a Resistor-Capacitor (RC) compensation circuit to provide a sufficient phase margin.

Accordingly, the linear amplifying stage should have linear characteristics for a signal having a wide bandwidth and therefore, should have a high Direct Current (DC) gain and a high Gain-Bandwidth product (GBW). Also, the linear amplifying stage is able to supply a large current to the RF power amplifier 205. The linear amplifying stage has a low output resistance value in order to compensate for ripple currents generated from the switching amplifying stage. The linear amplifying stage performs a rail-to-rail operation for the sake of a high output voltage.

Meantime, an output load resistance of the hybrid supply modulator for an ET amplifier is equivalent to a resistance 204 presented in a drain or collector of the RF power amplifier 205. The output load resistance of the hybrid supply modulator is varied in size depending on a power level of an input signal of the hybrid supply modulator. As the output load resistance value is varied, it is difficult to sufficiently maintain a phase margin characteristic of the linear amplifying stage that is designed for a specific load resistance value.

FIG. 3 is a graph illustrating a variation of the second pole dependent on a variation of an output load resistance value according to the related art.

Referring to FIG. 3, as an output resistance of the hybrid supply modulator is varied, the second pole ($\omega p2$) of the linear amplifying stage is varied. As the second pole ($\omega p2$) is varied, even a phase margin characteristic of the linear amplifying stage is varied. That is, a high load resistance value causes a shift of the second pole ($\omega p2$) to a low frequency domain, causing a deterioration of the phase margin characteristic of the linear amplifying stage. Therefore, at low RF input signal operation, the hybrid supply modulator is placed in an oscillation or unstable state.

Accordingly, a parasitic capacitance of a high-level transistor used in the push-pull output stage used for supplying large currents to the RF power amplifier 205 results in the shift of the second pole ($\omega p2$) to the low frequency domain, causing the failure of the linear amplifying stage to have a sufficiently high GBW. Therefore, because a ripple existing at a high frequency is not compensated by the linear amplifying stage, it deteriorates the spectrum characteristic of an output stage of the hybrid supply modulator.

Also, in order the push-pull output stage to maintain a sufficient linear characteristic and obtain a high efficiency characteristic, the push-pull output stage requires a class-AB bias. However, the class-AB bias is vulnerable to a characteristic of Process Voltage Temperature (PVT) variation that is the characteristic of the RF power amplifier. That is, a class-AB bias point is varied into a class-B bias point or class-C bias point in accordance with the PVT variation.

FIG. 4 illustrates a non-linear operation characteristic dependent on a bias variation of a push-pull output stage in a linear amplifying stage according to the related art.

Referring to FIG. 4, if a push-pull output stage 400 pushes and pulls current properly at a corresponding bias point, an output signal of a hybrid supply modulator has a good linear characteristic in step 410. If the push-pull output stage 400 fails to push and pull current properly at a corresponding bias point, an output signal of the hybrid supply modulator cannot maintain a linear characteristic, and has a distortion component, i.e., has a bad linear characteristic in step 420.

The instable characteristic or non-linear characteristic of the hybrid supply modulator generates a noise component or spurious component in an output of an envelope tracking amplifier, deteriorating an RF spectrum characteristic, and a noise characteristic at a receive stage band.

Accordingly, there is a need for an apparatus and method for power amplification for calibration capable of improving the stability, frequency characteristic, and linearity of a hybrid supply modulator in a transmitter.

SUMMARY OF THE INVENTION

Aspects of the present invention are to address at least the above-mentioned problems and/or disadvantages and to provide at least the advantages described below. Accordingly, an aspect of the present invention is to provide an apparatus and method for calibration enabling the improvement of the stability, frequency characteristic, and linearity of a hybrid supply modulator in a power amplifier.

Another aspect of the present invention is to provide an apparatus and method for enabling the calibration of a hybrid supply modulator dependent on an input signal level or a Process Voltage Temperature (PVT) variation when it is applied to an Envelope Tracking (ET) or Envelope Elimination and Restoration (EER) amplifier.

A further aspect of the present invention is to provide an apparatus and method for automatically adjusting a Gain-Bandwidth product (GBW) of a linear amplifying stage so as to process an input envelope signal having a wide bandwidth.

Yet another aspect of the present invention is to provide a hybrid supply modulator capable of having a stable and wide operation band through a calibration technique of a linear amplifying stage.

The above aspects are addressed by providing an apparatus and method for calibration of supply modulation in a transmitter.

In accordance with an aspect of the present invention, a transmit apparatus having a supply modulator is provided. The apparatus includes a detector and the supply modulator. The detector detects an output signal of the supply modulator. The supply modulator receives the detected output signal of the supply modulator from the detector and calibrates a modulation characteristic of the supply modulator.

In exemplary embodiments of the present invention, the apparatus further comprises a Radio Frequency (RF) power amplifier for amplifying an RF signal based on the output signal of the supply modulator.

In exemplary embodiments of the present invention, the RF power amplifier is one of an Envelope Tracking (ET) power amplifier and an Envelope Elimination and Restoration (EER) power amplifier.

In exemplary embodiments of the present invention, the supply modulator is a hybrid supply modulator, the hybrid supply modulator comprises a linear amplifying stage for receiving an envelope signal from a modulator/demodulator (modem) and for eliminating a ripple component comprised in an output signal of a switching amplifying stage and the switching amplifying stage for generating a signal for driving an RF power amplifier based on inputting of an output signal of the linear amplifying stage.

In exemplary embodiments of the present invention, the linear amplifying stage comprises a Resistor-Capacitor (RC) compensator, the RC compensator comprising an Operational Trans-conductance Amplifier (OTA) input stage, a push-pull output stage, and a plurality of Resistor-Capacitor (RC) pairs.

In exemplary embodiments of the present invention, the hybrid supply modulator calibrates one of a phase margin characteristic varying in accordance with a variable characteristic of an equivalent resistor of the RF power amplifier, calibrates a transistor level of a push-pull output stage, and calibrates a bias characteristic of the push-pull output stage depending on a Process Voltage Temperature (PVT) variation characteristic.

In accordance with another aspect of the present invention, a transmit apparatus having a supply modulator is provided. The apparatus includes a modulator/demodulator (modem) and the supply modulator. The modem provides a calibration signal for calibrating a modulation characteristic of the supply modulator, to the supply modulator. The supply modulator outputs a modulated signal in accordance with the calibrated modulation characteristic of the supply modulator based on the calibration signal from the modem.

In exemplary embodiments of the present invention, the supply modulator is a hybrid supply modulator, the hybrid supply modulator comprises a linear amplifying stage for receiving an envelope signal from the modem and for eliminating a ripple component comprised in an output signal of a switching amplifying stage and the switching amplifying stage for generating a signal for driving an RF power amplifier based on inputting of an output signal of the linear amplifying stage.

In exemplary embodiments of the present invention, the linear amplifying stage comprises a Resistor-Capacitor (RC) compensator, the RC compensator comprising an Operational Trans-conductance Amplifier (OTA) input stage, a push-pull output stage, and a plurality of Resistor-Capacitor (RC) pairs.

In exemplary embodiments of the present invention, the hybrid supply modulator one of calibrates a phase margin characteristic varying in accordance with a variable characteristic of an equivalent resistor of the RF power amplifier, calibrates a transistor level of a push-pull output stage, and calibrates a bias characteristic of the push-pull output stage depending on a Process Voltage Temperature (PVT) variation characteristic.

In accordance with another aspect of the present invention, a transmit apparatus having a supply modulator is provided. The apparatus includes a detector, a modem, and the supply modulator. The detector detects an output signal of the supply modulator. The modem receives the detected output signal of the supply modulator from the detector, determines a calibration signal for calibrating a modulation characteristic of the supply modulator, and provides the calibration signal to the supply modulator. The supply modulator outputs a modulated signal according to the modulation characteristic of the supply modulator that is calibrated based on the calibration signal provided from the modem.

In accordance with another aspect of the present invention, a method of calibrating a supply modulator of a transmitter is provided. The method includes detecting an output signal of the supply modulator, and receiving the detected output signal of the supply modulator from a detector and calibrating a modulation characteristic of the supply modulator.

In exemplary embodiments of the present invention, the method further comprises converting the output signal of the supply modulator detected from the detector, into a digital signal and calibrating the modulation characteristic of the supply modulator using the converted digital signal.

In exemplary embodiments of the present invention, the supply modulator is a hybrid supply modulator, the hybrid supply modulator comprises a linear amplifying stage for receiving an envelope signal from a modulator/demodulator (modem) and eliminating a ripple component comprised in an output signal of a switching amplifying stage and the switching amplifying stage for generating a signal for driving a Radio Frequency (RF) power amplifier based on inputting of an output signal of the linear amplifying stage.

In exemplary embodiments of the present invention, the linear amplifying stage comprises a Resistor-Capacitor (RC) compensator, the RC compensator comprising an Operational Trans-conductance Amplifier (OTA) input stage, a push-pull output stage, and a plurality of Resistor-Capacitor (RC) pairs.

In exemplary embodiments of the present invention, the hybrid supply modulator calibrates one of a phase margin characteristic varying in accordance with a variable characteristic of an equivalent resistor of the RF power amplifier, calibrates a transistor level of a push-pull output stage, and calibrates a bias characteristic of the push-pull output stage depending on a Process Voltage Temperature (PVT) variation characteristic.

In accordance with another aspect of the present invention, a method of calibrating a supply modulator of a transmitter is provided. The method includes providing a calibration signal for calibrating a modulation characteristic of the supply modulator, to the supply modulator, calibrating a modulation characteristic of the supply modulator based on the calibration signal from a modem, and outputting a modulated signal in accordance with the calibrated modulation characteristic of the supply modulator.

In exemplary embodiments of the present invention, the calibration signal is transmitted through one of a Serial Peripheral Interface (SPI) or an Inter-Integrated Circuit (I2C) bus.

In exemplary embodiments of the present invention, the method further comprises amplifying a Radio Frequency (RF) signal based on the output signal of the supply modulator.

In exemplary embodiments of the present invention, the method further comprises storing the calibration signal.

In exemplary embodiments of the present invention, the supply modulator is a hybrid supply modulator, the hybrid supply modulator comprises a linear amplifying stage for receiving an envelope signal from a modulator/demodulator (modem) and eliminating a ripple component comprised in an output signal of a switching amplifying stage and the switching amplifying stage for generating a signal for driving a Radio Frequency (RF) power amplifier based on inputting of an output signal of the linear amplifying stage.

In exemplary embodiments of the present invention, the linear amplifying stage comprises a Resistor-Capacitor (RC) compensator, the RC compensator comprising an Operational Trans-conductance Amplifier (OTA) input stage, a push-pull output stage, and a plurality of Resistor-Capacitor (RC) pairs.

In exemplary embodiments of the present invention, the hybrid supply modulator calibrates one of a phase margin characteristic varying in accordance with a variable characteristic of an equivalent resistor of the RF power amplifier, calibrates a transistor level of a push-pull output stage, and calibrates a bias characteristic of the push-pull output stage depending on a Process Voltage Temperature (PVT) variation characteristic.

In accordance with another aspect of the present invention, a method of calibrating a supply modulator of a transmitter is provided. The method includes detecting an output signal of the supply modulator, receiving the detected output signal of the supply modulator from a detector, determining a calibration signal for calibrating a modulation characteristic of the supply modulator, and providing the calibration signal to the supply modulator, and outputting a modulated signal according to the modulation characteristic of the supply modulator that is calibrated based on the calibration signal provided from a modem.

In exemplary embodiments of the present invention, the supply modulator is a hybrid supply modulator, the hybrid supply modulator comprises linear amplifying stage for receiving an envelope signal from the modem and eliminating a ripple component comprised in an output signal of a switching amplifying stage and the switching amplifying stage for generating a signal for driving a Radio Frequency (RF) power amplifier based on inputting of an output signal of the linear amplifying stage.

In exemplary embodiments of the present invention, the linear amplifying stage comprises a Resistor-Capacitor (RC) compensator, the RC compensator comprising an Operational Trans-conductance Amplifier (OTA) input stage, a push-pull output stage, and a plurality of Resistor-Capacitor (RC) pairs.

In exemplary embodiments of the present invention, the RC compensator selects at least one or more RC pairs based on a digital signal corresponding to the output signal of the supply modulator fed back from the detector, and calibrates a phase margin characteristic varying in accordance with a variable characteristic of an equivalent resistor of the RF power amplifier, and the resistor (R) and the capacitor (C) being positioned between the OTA input stage and the push-pull output stage.

In exemplary embodiments of the present invention, the push-pull output stage adjusts a transistor level of the push-pull output stage based on a digital signal corresponding to the output signal of the supply modulator fed back from the detector, and calibrates a Gain-Bandwidth product (GBW) characteristic of the push-pull output stage, and the transistor level of the push-pull output stage is adjusted by turning On/Off each of a plurality of power cells constructing the push-pull output stage based on the digital signal, each power cell being comprised of one P-type Metal-Oxide-Semiconductor (MOS) Field Effect Transistor (FET) and one N-type MOS FET, and the push-pull output stage selects a bias scheme based on 1st calibration data provided from the modem, and calibrates a bias characteristic varying in accordance with a Process Voltage Temperature (PVT) variation characteristic.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other objects, features and advantages of certain exemplary embodiments of the present invention will be more apparent from the following description taken in conjunction with the accompanying drawings, in which.

Throughout the drawings, like reference numerals will be understood to refer to like parts, components, and structures.

DETAILED DESCRIPTION OF EXEMPLARY EMBODIMENTS

Figure 1:
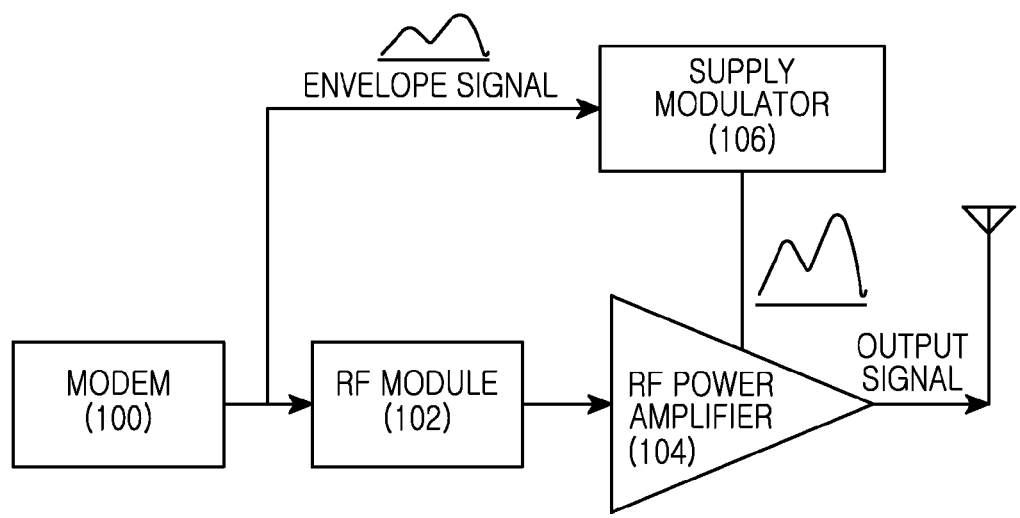
FIG. 1 is a block diagram illustrating an Envelope Tracking (ET) power amplifier architecture according to the related art.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Exemplary embodiments of the present invention will be described herein below with reference to the accompanying drawings. In the following description, well-known functions or constructions are not described in detail since they would obscure the invention in unnecessary detail. And, terms described below, which are defined considering functions in the exemplary embodiments of the present invention, can be different depending on a user and operator's intention or practice. Therefore, the terms should be defined on the basis of the present disclosure.

The exemplary embodiment of the present invention relate to a technology of calibrating the characteristic of a linear amplifying stage of a hybrid supply modulator that modulates a supply voltage of a power amplifier of a radio transmitter in accordance with an envelope of a Radio Frequency (RF) input signal of the hybrid supply modulator.

Below, the present disclosure describes an apparatus and method for calibration enabling the improvement of the stability, frequency characteristic, and linearity of a supply modulator in a power amplifier.

To calibrate the characteristic of the supply modulator in the power amplifier, the present exemplary embodiment includes a part for detecting an output signal, a feedback path for providing the detected output signal to a modulator/demodulator (modem) or a supply modulator, and a calibration register for storing a register value instructing to change the characteristic of a corresponding constituent element of the supply modulator. To calibrate the constituent element or device characteristic of the supply modulator, the supply modulator receives calibration data from the modem through a Serial Peripheral Interface (SPI), or receives a digital signal corresponding to an output signal directly detected from the feedback path. In implementation, instead of the SPI, other interface, i.e., an Inter-Integrated Circuit (I2C) bus may be used. The I2C bus is of a half-duplex scheme that is composed of connection of a Serial Clock Line (SCL) and a Serial Data Line (SDL) of a relationship of master and slave.

In implementation, a combination of a calibration scheme using the calibration data from the modem through the SPI and a calibration scheme using the digital signal corresponding to the output signal directly detected from the feedback path can be used. For example, calibration of the characteristics of some elements constructing the supply modulator makes use of the calibration data through the SPI, and calibration of the characteristics of other elements constructing the supply modulator makes use of the digital signal corresponding to the output signal directly detected from the feedback path.

Figure 5:
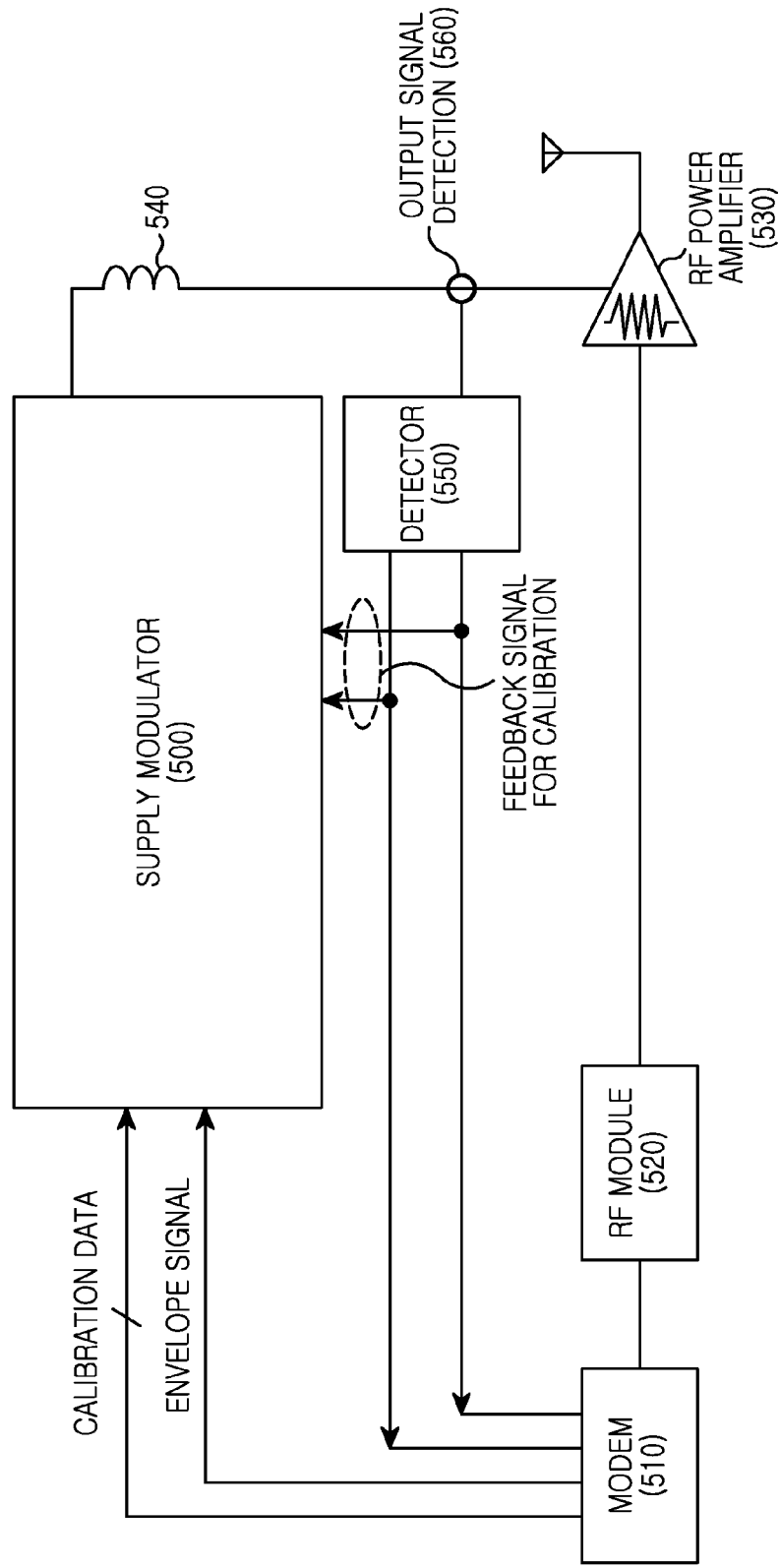
FIG. 5 is a block diagram illustrating a power amplifier architecture calibrating the characteristic of a general supply modulator according to an exemplary embodiment of the present invention.

FIG. 5 illustrates a transmitter including a power amplifier calibrating the characteristic of a general supply modulator according to an exemplary embodiment of the present invention. Referring to FIG. 5, the transmitter includes a supply modulator 500, a modem 510, a Radio Frequency (RF) module 520, an RF power amplifier 530, an inductor 540, and a detector 550.

The modem 510 processes a baseband signal (or an input signal) according to a corresponding communication scheme (e.g., an Orthogonal Frequency Division Multiplexing/Orthogonal Frequency Division Multiple Access (OFDM/OFDMA) communication scheme or a Code Division Multiple Access (CDMA) communication scheme), and outputs the baseband signal to the RF module 520. Also, the modem 510 provides an envelope component of the baseband signal to the supply modulator 500 through a corresponding interface, and provides calibration data for calibrating the characteristic of the supply modulator 500 and a calibration indication instruction (e.g., a clock signal) to the supply modulator 500 through an SPI. The calibration data is a digital signal, which is determined based on a feedback signal provided from the detector 550. The SPI is an interface capable of exchanging data by a serial communication between two peripheral devices. The one of the peripheral devices becomes a master and the other one becomes a slave. For example, the modem 510 becomes a master, and the supply modulator 500 becomes a slave.

Meantime, the modem 510 determines the calibration data for calibrating the characteristic of the supply modulator 500, based on an output signal of the supply modulator 530 provided through the detector 550. For instance, the modem 510 compares a desired output signal and a feedback signal, and determines the calibration data on the basis of the comparison result.

According to implementation, at an initial time, i.e., when there is not an input signal in the modem 510, the modem 510 may self generate a test signal instead of an envelope component of the input signal and provide the test signal to the supply modulator 500, to determine the calibration data.

The RF module 520 converts a baseband signal into an RF signal and outputs the RF signal to the RF power amplifier 530. Depending on an output signal of the supply modulator 500, the RF power amplifier 530 amplifies the RF signal provided from the RF module 520 and then, outputs the amplified RF signal through an antenna. Here, the RF power amplifier 530 can operate based on an Envelope Tracking (ET) or Envelope Elimination and Restoration (EER) technique. And, the output signal of the supply modulator 500 is used as a driving signal of the RF power amplifier 530.

The supply modulator 500 provides a switching signal or driving signal to the RF power amplifier 530 according to an envelope signal provided from the modem 510. In other words, the switching signal or driving signal of the supply modulator 500 is provided to a drain or collector of the RF power amplifier 530, and is used as a current source or a voltage source of the RF power amplifier 530.

Also, the supply modulator 500 converts a feedback signal (i.e., an output signal of the supply modulator 500) provided from the detector 550, into a digital signal and performs automatic calibration based on the converted digital signal. That is, the digital signal corresponding to the output signal of the supply modulator 500 is used as the calibration data for calibrating the characteristic of the supply modulator 530, and is used for calibrating the characteristic of the supply modulator 500. Calibrating the characteristic of the supply modulator 500 means calibrating a parameter determining the performance of the supply modulator 500. And, the supply modulator 500 calibrates the parameter determining the performance of the supply modulator 500, based on a clock signal and calibration data provided from the modem 510.

The detector 550 detects an output signal of the supply modulator 500 as denoted by reference numeral 560, and provides the detected output signal to the supply modulator 500 or the modem 510.

Figure 6:
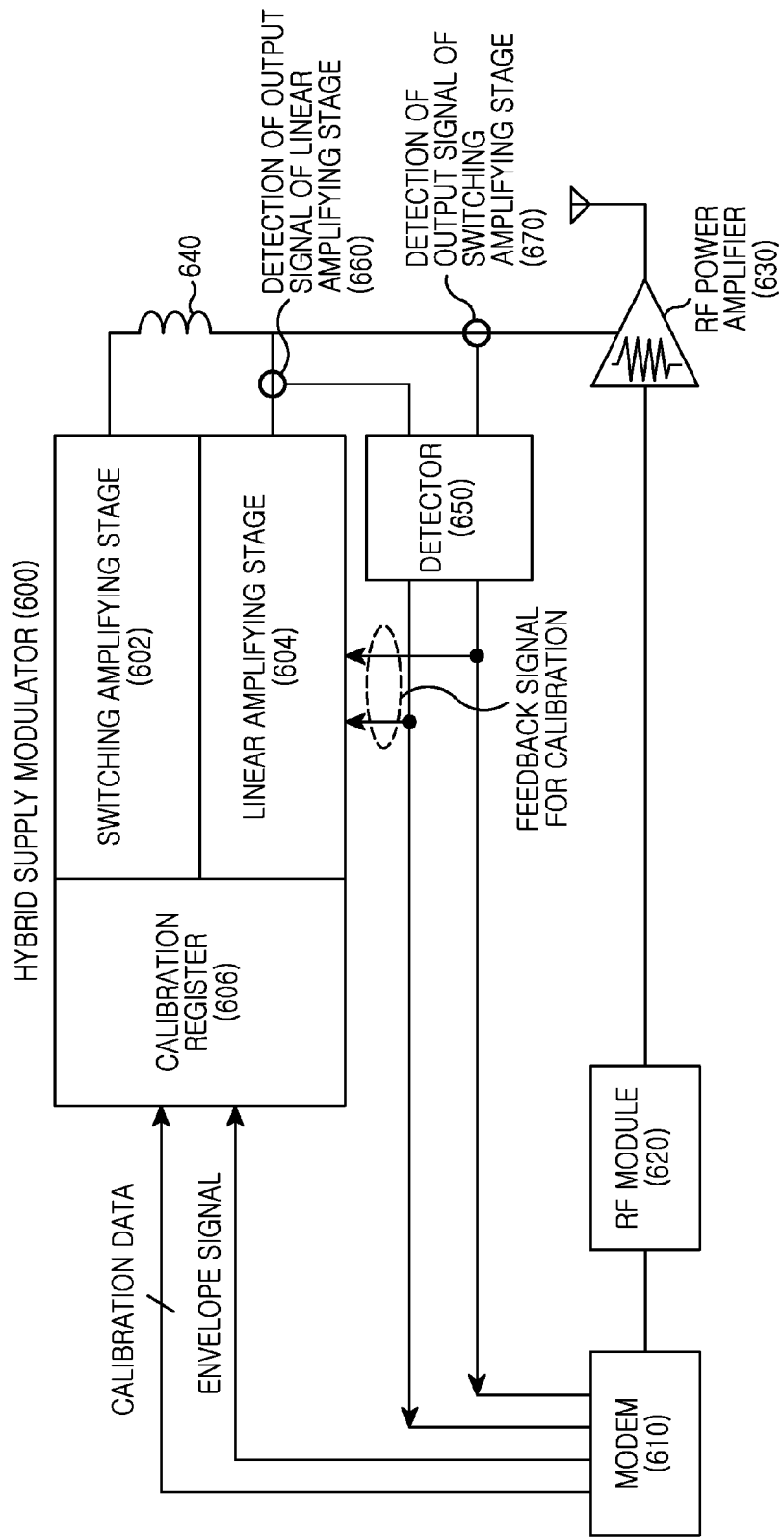
FIG. 6 is a block diagram illustrating a power amplifier architecture calibrating the characteristic of a hybrid supply modulator according to an exemplary embodiment of the present invention.

FIG. 6 illustrates a transmitter including a power amplifier calibrating the characteristic of a hybrid supply modulator according to an exemplary embodiment of the present invention.

Referring to FIG. 6, the transmitter includes a hybrid supply modulator 600, a modem 610, an RF module 620, an RF power amplifier 630, an inductor 640, and a detector 650. Here, the RF power amplifier 630 can operate based on an ET or EER technique.

The modem 610 processes a baseband signal according to a corresponding communication scheme (e.g., an OFDM/OFDMA communication scheme or a CDMA communication scheme), and outputs the baseband signal to the RF module 620. Also, the modem 610 provides an envelope component of the baseband signal to the hybrid supply modulator 600 through a corresponding interface, and provides calibration data for calibrating the characteristic of the hybrid supply modulator 600 and a clock signal to the hybrid supply modulator 600 through an SPI. The calibration data for calibrating the characteristic of the hybrid supply modulator 600 is determined based on a feedback signal provided from the detector 650. For instance, the modem 610 compares a desired output signal and the feedback signal, and determines the calibration data on the basis of the comparison result.

According to implementation, at an initial time, i.e., when there is not an input signal in the modem 610, the modem 610 may self generate a test signal instead of an envelope component of the input signal and provide the test signal to the hybrid supply modulator 600, to determine the calibration data.

The RF module 620 converts a baseband signal into an RF signal and outputs the RF signal to the RF power amplifier 630. Depending on a switching signal output from a switching amplifying stage 602 of the hybrid supply modulator 600, the RF power amplifier 630 amplifies the RF signal output from the RF module 620 and then, outputs the amplified RF signal through an antenna.

The hybrid supply modulator 600 includes the switching amplifying stage 602, a linear amplifying stage 604, and a calibration register 606. To calibrate the characteristics of constituent elements or devices of the linear amplifying stage 604, the calibration register 606 stores calibration data for calibrating the characteristic (e.g., parameters determining the performance of the hybrid supply modulator 600) of the hybrid supply modulator 600, from the modem 610. The switching amplifying stage 602 provides necessary currents to the RF power amplifier 630. The linear amplifying stage 604 eliminates a ripple characteristic, which is included in an output signal (i.e., switching currents) of the switching amplifying stage 602.

The calibration register 606 stores three calibration values for calibrating the characteristic of the linear amplifying stage 604 of the hybrid supply modulator 600. Firstly, the calibration register 606 stores a 1st calibration value for calibrating a phase margin characteristic of the linear amplifying stage 604 resulting from a variable characteristic of an equivalent resistor of the RF power amplifier 630 dependent on an RF input signal magnitude level of the RF power amplifier 630. Secondly, the calibration register 606 stores a 2nd calibration value for automatically adjusting a transistor level of a push-pull output stage according to a real-time magnitude of an input envelope signal of the hybrid supply modulator 600, and calibrating a level of an optimal push-pull output stage suitable to a desired output signal magnitude. And, the calibration register 606 can control the second pole since a parasitic capacitance of a transistor is automatically controlled. By controlling the second pole, the calibration register 606 can improve a Gain-Bandwidth product (GBW) characteristic of the linear amplifying stage 604. Thirdly, the calibration register 606 stores a 3rd calibration value for calibrating a variation of a bias characteristic of the push-pull output stage dependent on a Process Voltage Temperature (PVT) variation.

On the other hand, the calibration register 606 provides the stored calibration data to the switching amplifying stage 602 or the linear amplifying stage 604, according to a clock signal provided together with the calibration data provided from the modem 610. That is, the clock signal provided from the modem 610 is used as an indication instruction for calibrating the characteristic of the switching amplifying stage 602 of the hybrid supply modulator 600 or the linear amplifying stage 604 thereof.

Meantime, the majority of currents provided to the RF power amplifier 630 are supplied through the switching amplifying stage 602 of the hybrid supply modulator 600. The linear amplifying stage 604 pushes and pulls compensating currents so as to compensate for a linear distortion, which is caused by a ripple characteristic included in currents when an output signal of the switching amplifying stage 602 passes through an inductor 640. In other words, when the output signal of the switching amplifying stage 602 is small, the linear amplifying stage 604 pushes currents to the output signal of the switching amplifying stage 602 and, when the output signal of the switching amplifying stage 602 is large, the linear amplifying stage 604 pulls currents from the output signal of the switching amplifying stage 602. As the architecture of the switching amplifying stage 602 of the hybrid supply modulator 600, it generally uses a buck converter.

Figure 2:
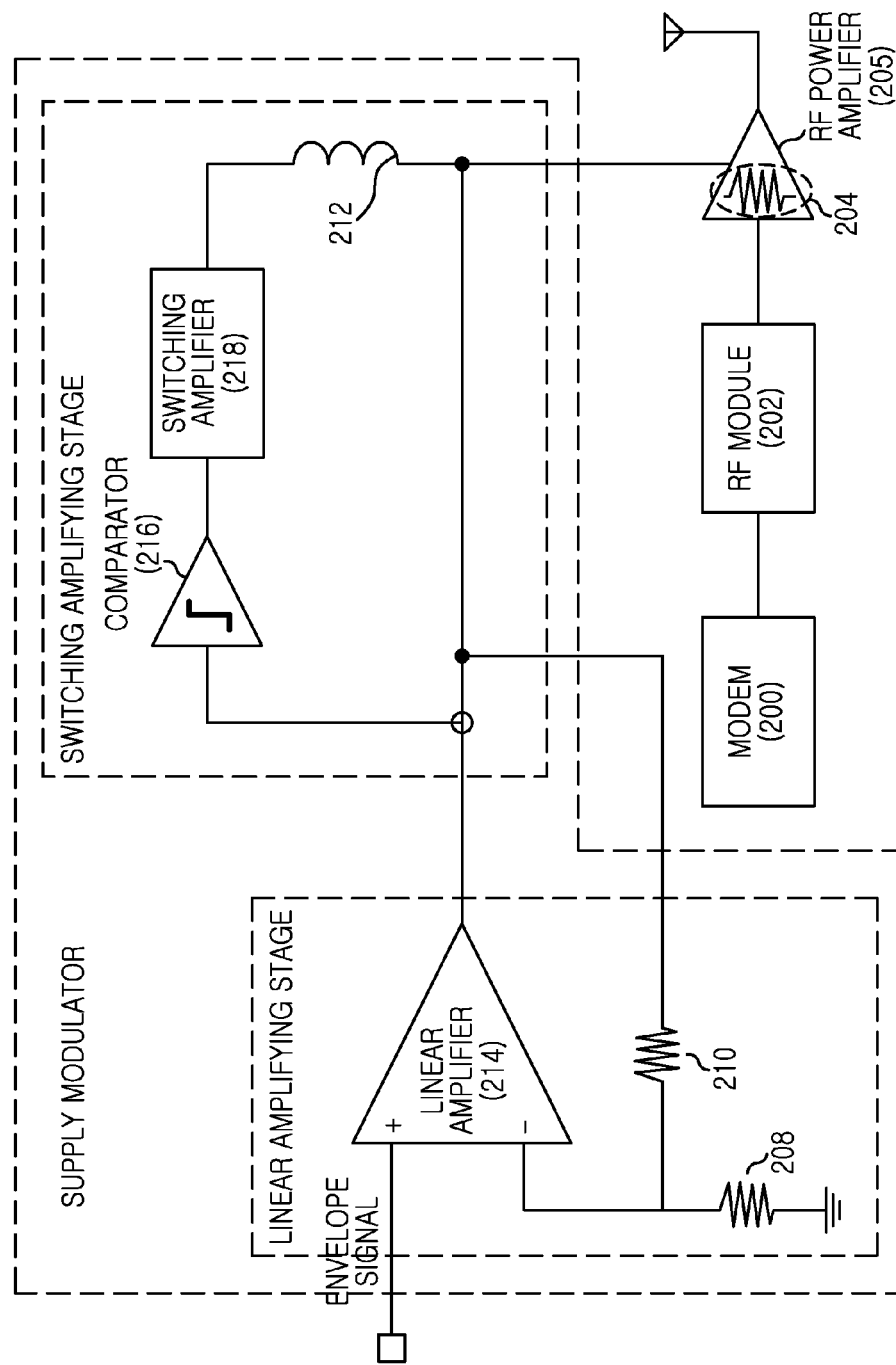
FIG. 2 is a block diagram illustrating a power amplifier architecture using a hybrid supply modulator according to the related art.
Figure 3:
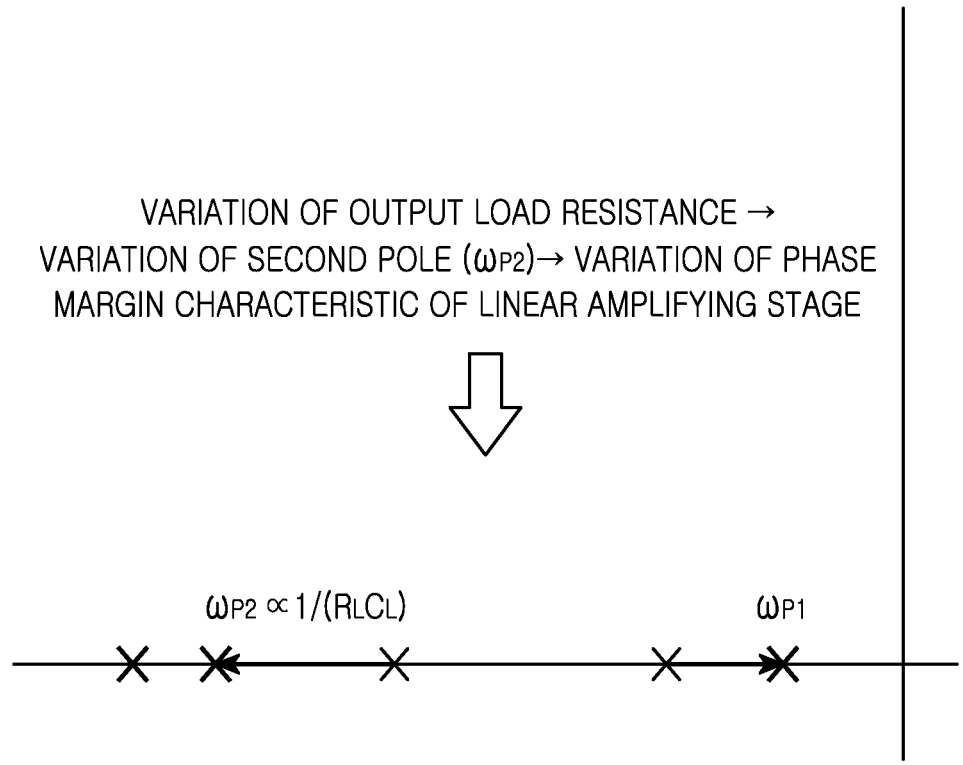
FIG. 3 is a graph illustrating a variation of the second pole dependent on a variation of an output load resistance value according to the related art.

The switching amplifying stage 602 includes, as in FIG. 2, a comparator for generating a switching signal and a switching amplifier for switching a level of the switching signal. Likewise, the linear amplifying stage 604 includes, as in FIG. 2, an Operational Trans-conductance Amplifier (OTA) input stage (or OP amp) (not shown) having a high gain, a class-AB bias stage (not shown), a push-pull output stage (not shown), and a stability compensation feedback Resistor (R) and Capacitor (C).

The OTA input stage having a high gain characteristic generates a control signal for controlling to make an input reference signal and an output voltage identical with each other. The class-AB bias stage enhances an efficiency characteristic of the push-pull output stage and supplies a bias to have a desired linear characteristic. The push-pull output stage outputs a current component of a high frequency domain that the switching amplifying stage 602 fails to provide sufficiently. Accordingly, a transistor level of the push-pull output stage is determined based on a maximum value based upon design. However, the maximum level of the push-pull output stage causes a big parasitic capacitance, deteriorating a BandWidth (BW) characteristic of the linear amplifying stage 604. Also, the linear amplifying stage 604 has a Resistor-Capacitor (RC) compensation circuit to provide a sufficient phase margin. That is, the Resistor (R) and the Capacitor (C) are added between the OTA input stage and the push-pull output stage.

Accordingly, the linear amplifying stage 604 maintains a high Direct Current (DC) gain and a high GBW so as to maintain a linear characteristic for a signal having a wide bandwidth. Also, the linear amplifying stage 604 supplies a large amount of current to the RF power amplifier 630. The linear amplifying stage 604 has a low output resistance value in order to compensate for ripple currents generated from the switching amplifying stage 602. The linear amplifying stage 604 performs a rail-to-rail operation for the sake of a high output voltage.

So, the present exemplary embodiment can maintain a linear characteristic for a signal having a wide bandwidth, using the 2nd calibration value and 3rd calibration value stored in the calibration register 606. The 2nd calibration value is a value for automatically adjusting the transistor level of the push-pull output stage according to a real-time magnitude of an input envelope signal of the hybrid supply modulator 600 and automatically calibrating a level of an optimal push-pull output stage suitable to a desired output signal magnitude. The 3rd calibration value is a value for calibrating a variation of a bias characteristic of the push-pull output stage dependent on a PVT variation. Also, the present exemplary embodiment eliminates a parasitic capacitance capable of being generated in the push-pull output stage designed to have a maximal transistor level, making better a bandwidth characteristic of the linear amplifying stage 604. Here, through the level adjustment of the push-pull output stage, only a necessary power cell is turned On, and an unnecessary power cell is turned Off.

According to another exemplary embodiment, a linear characteristic can be maintained for a signal having a wide bandwidth using an output signal directly detected through a feedback path, i.e., an output signal 670 of the switching amplifying stage 602 or an output signal 660 of the linear amplifying stage 604, eliminate a parasitic capacitance, and make better a bandwidth characteristic of the linear amplifying stage 604.

Meantime, an output load resistance of the hybrid supply modulator 600 for an ET amplifier is equivalent to a resistance presented in a drain or collector of the RF power amplifier 605. The output load resistance of the hybrid supply modulator 600 is varied in size depending on a power level of an input signal of the hybrid supply modulator 600. As the output load resistance value is varied, it is difficult to sufficiently maintain a phase margin characteristic of the linear amplifying stage 604 that is designed for a specific load resistance value.

So, the present exemplary embodiment maintains a phase margin characteristic using the 1st calibration value stored in the calibration register 606 or the output signal detected through the feedback path. The 1st calibration value is a value for calibrating the phase margin characteristic of the linear amplifying stage 604 resulting from a variable characteristic of an equivalent resistor of the RF power amplifier 630 dependent on an RF input signal magnitude level of the RF power amplifier 630. The output signal detected through the feedback path is an output signal of the switching amplifying stage 602 or an output signal of the linear amplifying stage 604.

The 1st calibration value is a Resistor (R) value and a corresponding Capacitor (C) capacitance to be connected between the OTA input stage and the push-pull output stage in accordance with the variable characteristic of the equivalent resistor of the RF power amplifier 630.

Figure 7:
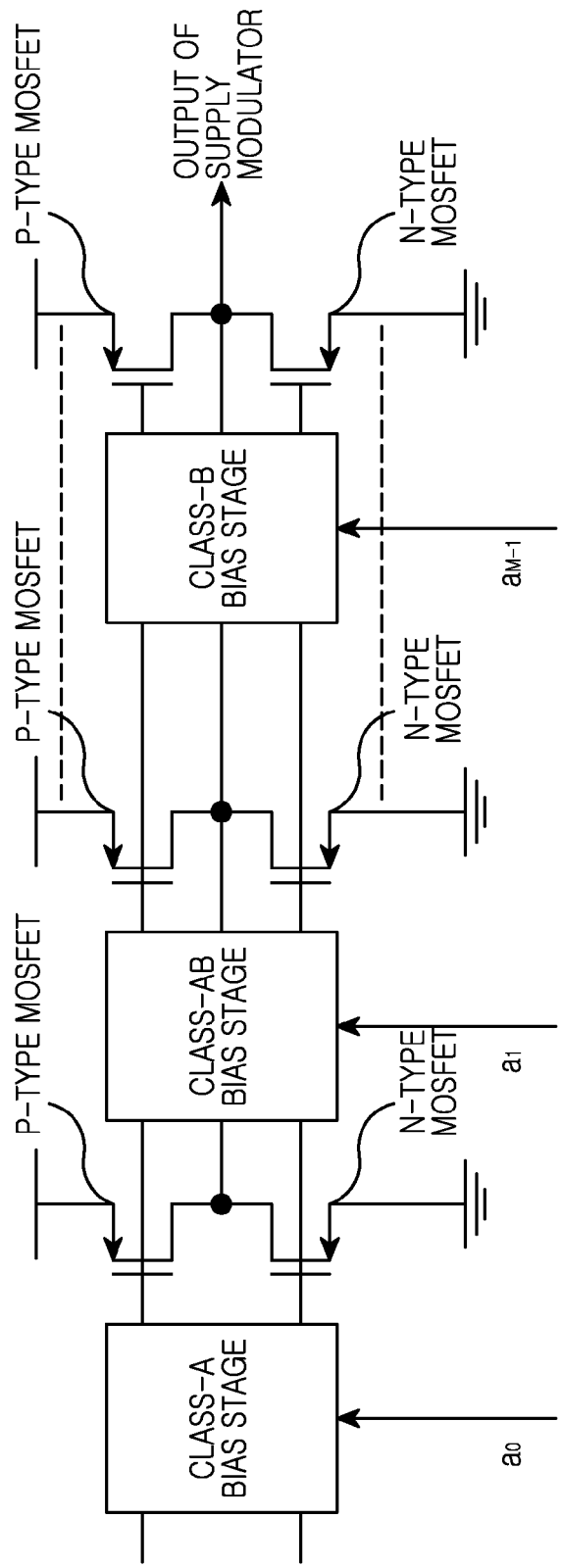
FIG. 7 is a block diagram illustrating a construction of a push-pull output stage, which is composed of power cells operating at a few bias points, in a linear amplifying stage of a hybrid supply modulator according to an exemplary embodiment of the present invention.

FIG. 7 illustrates a construction of a push-pull output stage, which is composed of power cells operating at a few bias points, in a linear amplifying stage of a hybrid supply modulator according to an exemplary embodiment of the present invention.

Referring to FIG. 7, in the linear amplifying stage, the push-pull output stage is comprised of a plurality of power cells. One power cell is comprised of one P-type Metal-Oxide-Semiconductor (MOS) Field Effect Transistor (FET) and one N-type MOS FET.

In the present exemplary embodiment, a bias of the push-pull output stage is determined through a suitable one bias scheme among a plurality of bias schemes (i.e., a class-A bias, a class-AB bias, and a class-B bias), using register values (a0, a1, . . . , aM−1) stored in the calibration register 606 or a digital signal corresponding to an output signal detected through a feedback path, i.e., an output signal 660 of the linear amplifying stage 604 or an output signal 670 of the switching amplifying stage 602.

The push-pull output stage of the related art is composed of one power cell composed of one P-type MOS FET and one N-type MOS FET. Unlike this, as in FIG. 8, the push-pull output stage according to the present exemplary embodiment is comprised of a plurality of power cells comprised of a plurality of P-type MOS FETs and a plurality of N-type MOS FETs.

Meantime, a transmission/reception power intensity is controlled according to a distance between a Base Station (BS) and a terminal, a signal attenuation amount, and a channel use amount. In an ET power amplifier and an EER power amplifier, an equivalent resistor of the RF power amplifier is variable depending on a magnitude of an RF input signal of the RF power amplifier. In the hybrid supply modulator, as a current amount supplied to the RF power amplifier is less, an equivalent resistor of the RF power amplifier is large. Accordingly, as in FIG. 8 below, the hybrid supply modulator detects a current amount of an output signal and, depending on a current magnitude, the hybrid supply modulator controls a compensation circuit of a Resistor-Capacitor (RC) bank 820. The RC bank 820 manages a plurality of Resistor-Capacitor (RC) pairs to be added between the OTA input stage and the respective power cells of the push-pull output stage.

Figure 8:
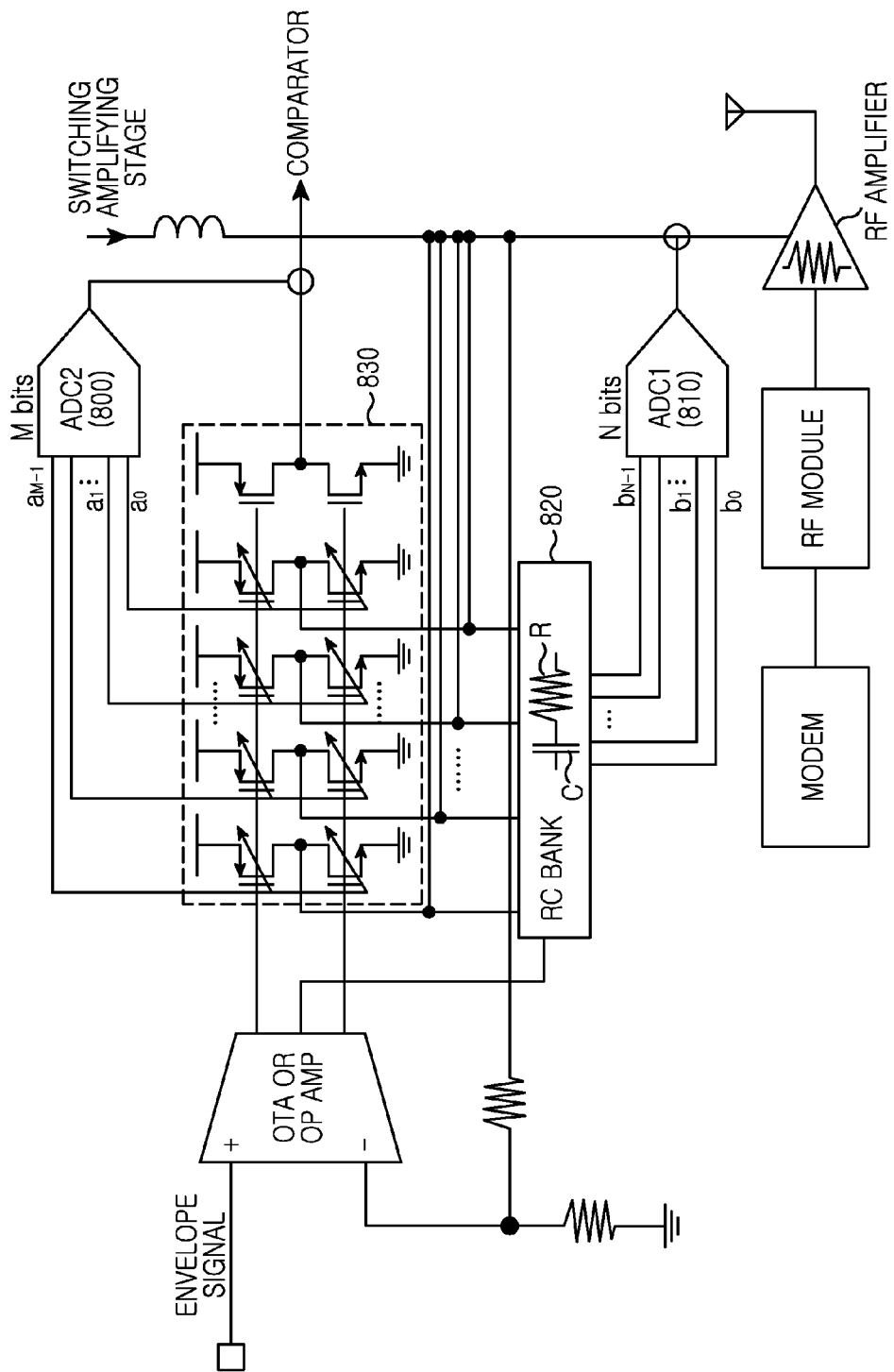
FIG. 8 is a block diagram illustrating a construction of an apparatus for calibrating the characteristic of a linear amplifying stage in a hybrid supply modulator according to an exemplary embodiment of the present invention.

FIG. 8 illustrates a construction of an apparatus for calibrating the characteristic of a linear amplifying stage in a hybrid supply modulator according to an exemplary embodiment of the present invention.

Referring to FIG. 8, the linear amplifying stage includes a 1st N-bit Analog-to-Digital Converter (ADC) 810 and a 2nd M-bit ADC 800 for converting detected analog output signals into digital signals, and an RC bank (or RC compensator) 820 for managing resistors and capacitors positioned between an OTA input stage and a push-pull output stage 830 so as to adjust a phase margin.

The 1st N-bit ADC 810 converts a current component of a detected output signal of a switching amplifying stage, into digital information. Here, the 'N' is an integer. The linear amplifying stage controls the converted digital information to have a suitable RC compensation value depending on an amount of current of the detected output signal of the switching amplifying stage. The linear amplifying stage controls a second pole position resulting from an equivalent resistor of an RF power amplifier dependent on a variation of an RF input signal of the RF power amplifier, and maintains a stable phase margin. That is, the linear amplifying stage can control the second pole position by adding resistors and capacitors between the OTA input stage and the respective power cells of the push-pull output stage 830.

Also, the push-pull output stage 830 of the linear amplifying stage has a high transistor level to provide a large amount of current to the RF power amplifier, and performs a rail-to-rail operation to have a wide voltage region. And, the push-pull output stage 830 operates with a class-AB bias to maintain an efficiency characteristic of the linear amplifying stage and a linear characteristic thereof. Also, the push-pull output stage 830 maintains a high GBW characteristic in order to process an envelope signal of a wide bandwidth. However, a big parasitic capacitance resulting from the high transistor level of the push-pull output stage 830 causes a shift of the second pole position to a low frequency domain, deteriorating an operation frequency characteristic of the linear amplifying stage. In an existing linear amplifying stage, a transistor level constructing a push-pull output stage is fixed to a level for allowing a flow of maximum output current. However, an input envelope signal having a high PAPR gives a flow of average current. Therefore, the transistor level of the push-pull output stage 830 adapted to a peak amount of current unnecessarily has a high value. That is, a power cell composed of unnecessary N-type MOS FET and P-type MOS FET is driven. Therefore, the high transistor level results in not only a slow operation speed of the linear amplifying stage but also the unnecessary consumption of direct currents.

So, the present exemplary embodiment detects a magnitude of an output current of the push-pull output stage 830 and calibrates a power cell level of the push-pull output stage 830. For instance, a current component of a detected output signal of the linear amplifying stage is converted into digital information through the 2nd M-bit ADC 800. The phase-converted digital information turns On/Off a power cell corresponding to the detected magnitude of the output current of the push-pull output stage 830. Here, the 'M' is an integer.

In other words, the push-pull output stage 830 is distinguished into a plurality of power cells. Each power cell is controlled by an output digital signal of the 2nd M-bit ADC 800 to have a suitable level depending on an amount of current of an output signal of the 2nd M-bit ADC 800. When a large flow of current is needed, all output digital bits of the 2nd M-bit ADC 800 are turned On and enable all the power cells of the push-pull output stage 830 and, when a flow of a small amount of current is needed, some output digital bits of the 2nd M-bit ADC 800 are turned On and unnecessary power cells of the push-pull output stage 830 are stopped, thereby adjusting a transistor level of the push-pull output stage 830.

Figure 4:
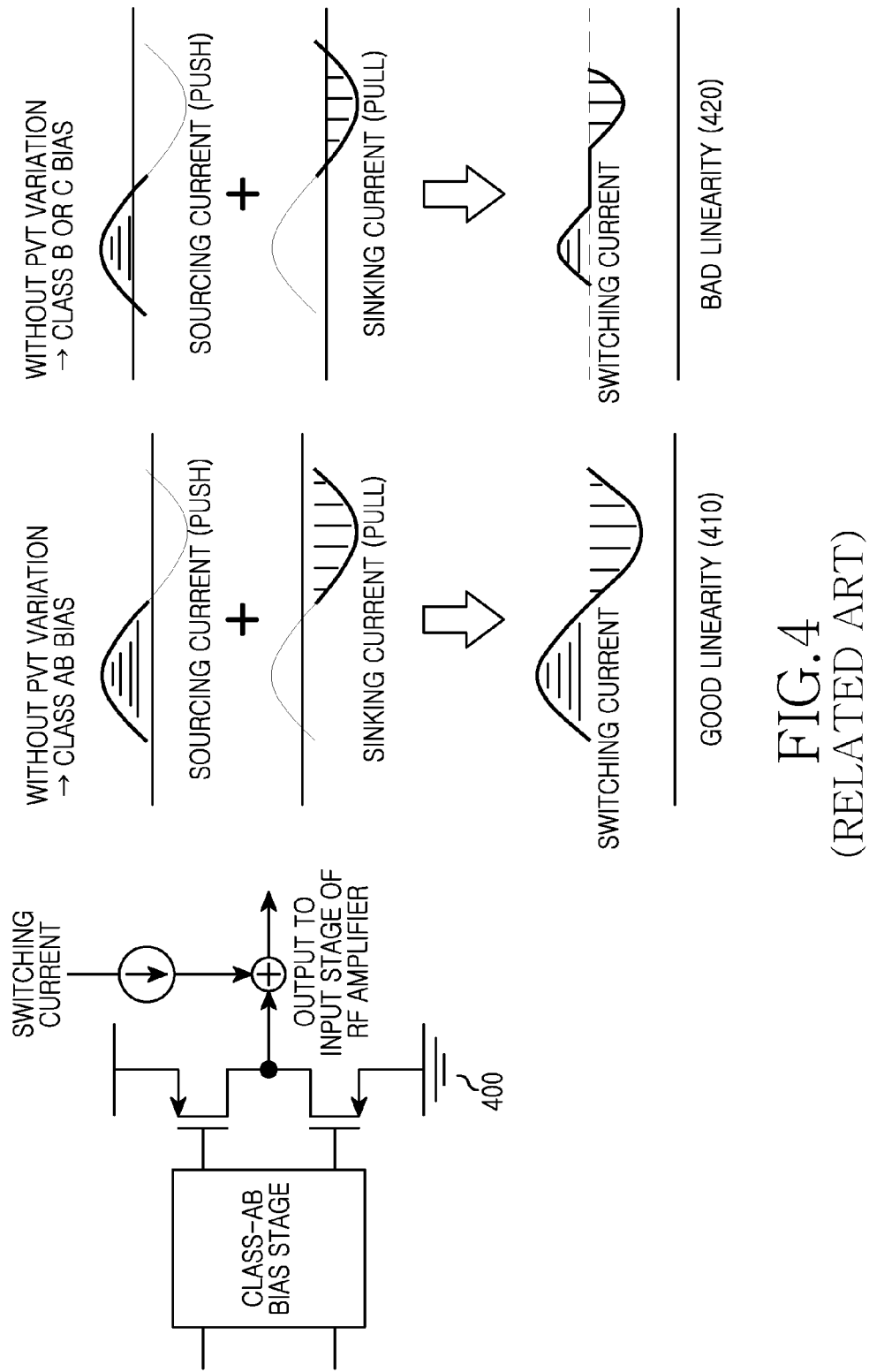
FIG. 4 is a diagram illustrating a non-linear operation characteristic dependent on a bias variation of a push-pull output stage in a linear amplifying stage according to the related art.

As described above, the push-pull output stage 830 of the linear amplifying stage needs a large current capacity and at the same time, requires a high efficiency characteristic. Therefore, as in FIG. 4, the push-pull output stage 830 operates with a class-AB bias to have both the high efficiency characteristic and a linear characteristic. However, it is difficult for the class-AB bias to accurately maintain an operation region depending on a PVT variation occurring. By the PVT variation, the class-AB bias can be varied into a class-B bias or class-C bias. Accordingly, undesirably, the push-pull output stage 830 can take a non-linear characteristic as in FIG. 4.

So, in the present exemplary embodiment, the power cells of the push-pull output stage 830 are coupled to maintain different biases according to the PTV variation, respectively. Levels of the power cells operating with the respective biases correspond to an optimal point maintaining optimal efficiency and linearity. Among the respective power cells, a power cell biased to a class-A bias point does not suffer in linearity despite suffering a bias variation due to the PVT variation. Therefore, although a power cell operates with a class-B bias or class-C bias enhancing efficiency but deteriorating a linear characteristic, the power cell is coupled with an operation characteristic of the power cell biased to the class-A bias point, thereby being able to maintain the linear characteristic. Thus, the push-pull output stage 830 of the linear amplifying stage takes the effect of bias dithering by the present exemplary embodiment, so the push-pull output stage 830 can become insensitive to the PVT variation, and thus perform stable operation.

Figure 9:
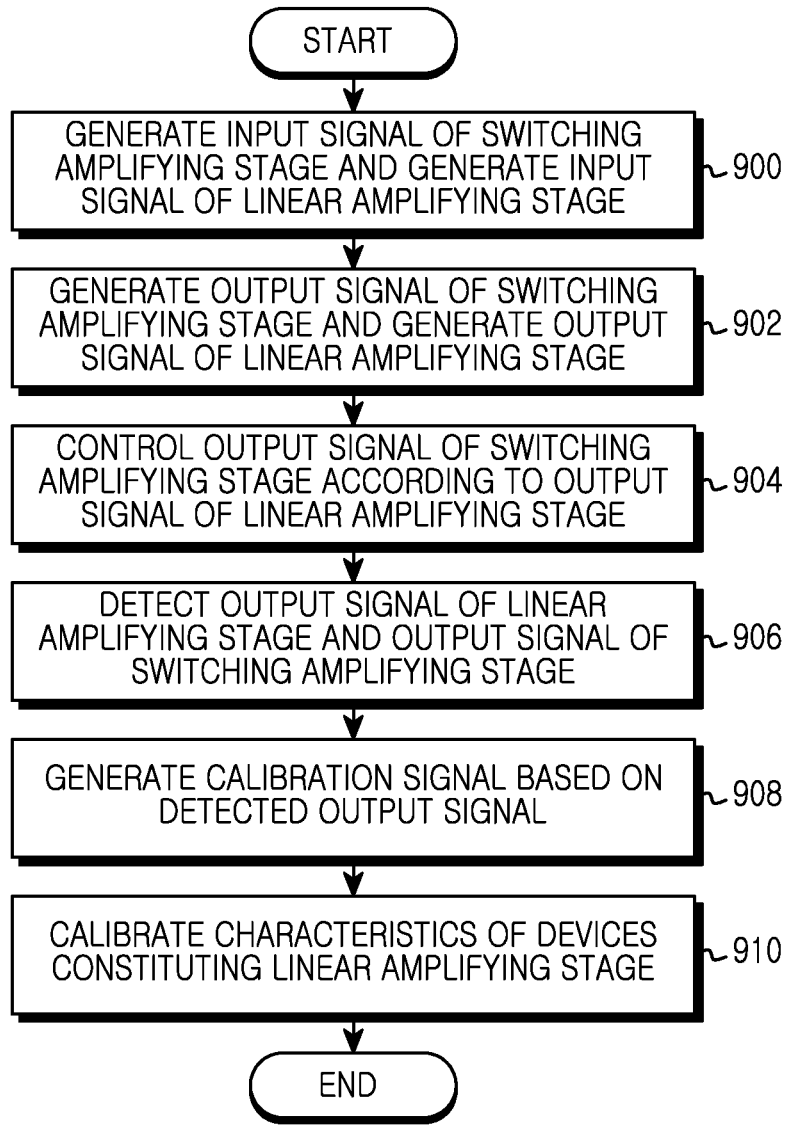
FIG. 9 is a flowchart illustrating an operation of calibrating the characteristic of a linear amplifying stage in a power amplifier using a hybrid supply modulator according to an exemplary embodiment of the present invention.

FIG. 9 is a flowchart illustrating an operation of a transmitter including a power amplifier using a hybrid supply modulator according to an exemplary embodiment of the present invention.

Referring to FIG. 9, in step 900, the transmitter generates an input signal of a switching amplifying stage 602 and generates an input signal of a linear amplifying stage 604. The input signal of the linear amplifying stage 604 is an envelope signal and a reference signal. The reference signal is a feedback of an output signal of the linear amplifying stage 604. And, the input signal of the switching amplifying stage 602 becomes the output signal of the linear amplifying stage 604.

After that, in step 902, the transmitter generates an output signal of the switching amplifying stage 602 and generates an output signal of the linear amplifying stage 604. The output signal of the linear amplifying stage 604 is generated through a comparison between the envelope signal and the reference signal. The switching amplifying stage 602 receives an input of the output signal of the linear amplifying stage 604, and generates the output signal of the switching amplifying stage 602.

Next, in step 904, the transmitter controls the output signal of the switching amplifying stage 602 according to the output signal of the linear amplifying stage 604. For instance, when the output signal of the switching amplifying stage 602 is less, the transmitter directs a flow of a current signal of the linear amplifying stage 604 to an output stage of the switching amplifying stage 602 and, when the output signal of the switching amplifying stage 602 is large, the transmitter directs a flow of a partial current signal of the output signal of the switching amplifying stage 602 to the linear amplifying stage 604.

After that, in step 906, a detector 650 detects the output signal of the linear amplifying stage 604 and the output signal of the switching amplifying stage 602, and provides the detected output signal of the linear amplifying stage 604 and the detected output signal of the switching amplifying stage 602 to a modem 610 or the linear amplifying stage 604.

Next, in step 908, the modem 610 or the linear amplifying stage 604 generates calibration data based on the fed-back output signal of the linear amplifying stage 604 and the fed-back output signal of the switching amplifying stage 602. For instance, the modem 610 compares the fed-back output signal and a desired output signal to determine the calibration data, and the linear amplifying stage 604 converts a digital signal corresponding to the fed-back output signal and uses the converted digital signal as the calibration data.

The calibration data includes at least one or more of an RC value (hereinafter, referred to as a '1st calibration value') for calibrating a phase margin characteristic of the linear amplifying stage 604 resulting from a variable characteristic of an equivalent resistor of an RF power amplifier 630 dependent on an RF input signal magnitude level of the RF power amplifier 630, an On/Off value (hereinafter, referred to as a '2nd calibration value') of a power cell for adjusting a transistor level of a push-pull output stage depending on a magnitude of an input envelope signal of a hybrid supply modulator 600, and a value (hereinafter, referred to as a '3rd calibration value') instructing a bias characteristic of the push-pull output stage dependent on a PVT variation.

After that, in step 910, the linear amplifying stage 604 controls On/Off of the power cells constructing the push-pull output stage based on the calibration data, determines an RF calibration value between an OTA input stage and the push-pull output stage, and determines a bias scheme (i.e., one of a class-A bias scheme, a class-AB bias scheme, and a class-B bias scheme) of the push-pull output stage.

For example, the linear amplifying stage 604 determines the bias scheme (i.e., one of the class-A bias scheme, the class-AB bias scheme, and the class-B bias scheme) of the push-pull output stage based on the calibration data provided from the modem 610 and a clock signal, and also controls the On/Off of the power cells constructing the push-pull output stage based on a digital signal corresponding to an output signal directly fed back from the detector 650, and determines an RF calibration value between the OTA input stage and the push-pull output stage.

Next, the transmitter terminates the procedure of the present exemplary embodiment.

Herein, a description has been made for an exemplary embodiment of detecting an output signal of a linear amplifying stage of a supply modulator and an output signal of a switching amplifying stage and calibrating the characteristics of devices or constituent elements constructing the linear amplifying stage. Without being limited to this, the present exemplary embodiment may detect the output signal of the linear amplifying stage of the supply modulator and the output signal of the switching amplifying stage and calibrate the characteristics of devices or constituent elements constructing the switching amplifying stage. Or, the present exemplary embodiment may detect the output signal of the linear amplifying stage of the supply modulator and the output signal of the switching amplifying stage and calibrate the characteristics of devices or constituent elements constructing both the linear amplifying stage and the switching amplifying stage.

Figure 10:
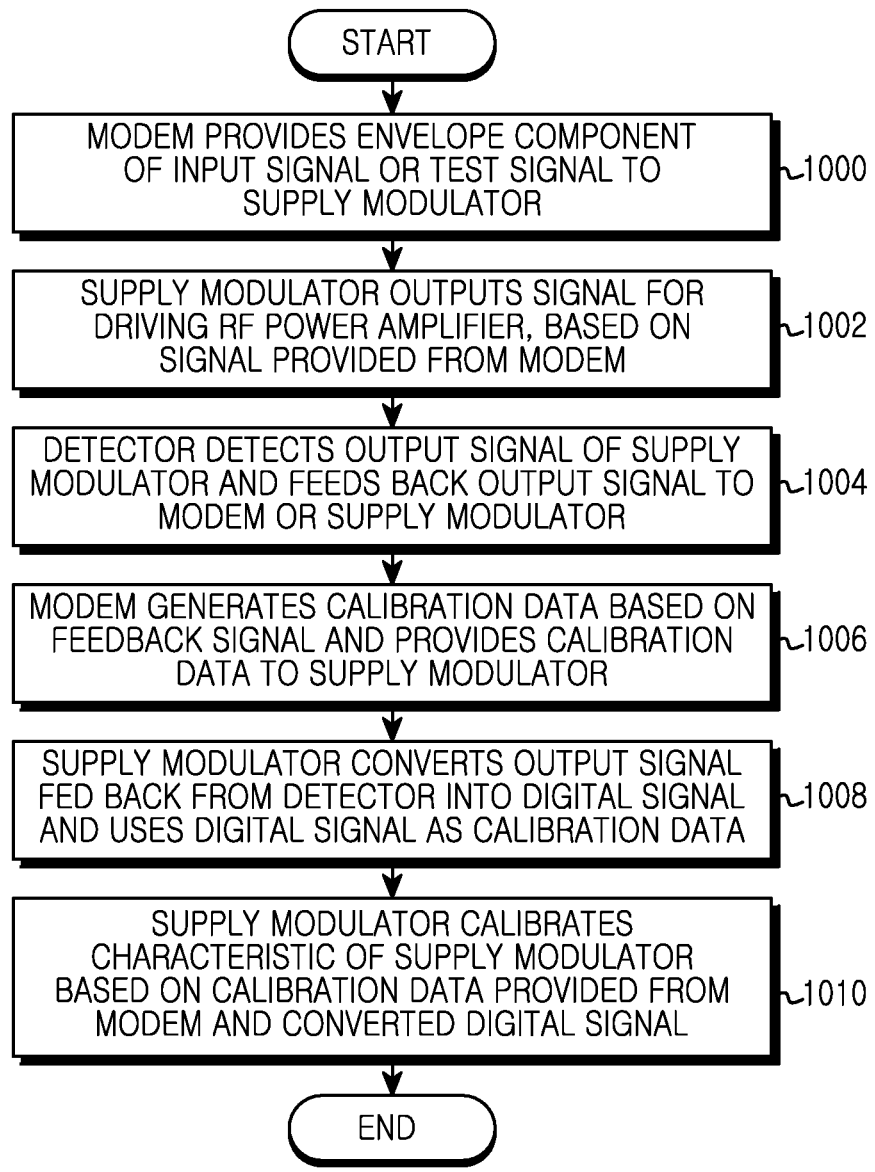
FIG. 10 is a flowchart illustrating an operation of calibrating an initial supply modulator in a power amplifier using a general supply modulator according to an exemplary embodiment of the present invention.

FIG. 10 is a flowchart illustrating an operation of a transmitter including a power amplifier using a general supply modulator according to an exemplary embodiment of the present invention.

Referring to FIG. 10, in step 1000, a modem 510 provides an envelope component of an input signal to a supply modulator 500. When there is not an initial input signal, the modem 510 itself provides a test signal to the supply modulator 500.

After that, in step 1002, the supply modulator 500 generates an output signal for driving an RF power amplifier 530, using the envelope component of the input signal provided from the modem 510 or the test signal.

In other words, when the modem 510 supplies the input signal during an operation of the transmitter, the modem 510 provides the envelope component of the input signal to the supply modulator 500 to use the envelope component as a calibration signal for calibrating the characteristic of the supply modulator 500. In a case where there is not an input signal when the transmitter initially powers on, the modem 510 provides a self-test signal to the supply modulator 500 to use the self-test signal as the calibration signal for calibrating the characteristic of the supply modulator 500.

Next, in step 1004, a detector 550 detects an output signal of the supply modulator 500, and feeds back the detected output signal of the supply modulator 500 to the modem 510 or the supply modulator 500.

After that, in step 1006, the modem 510 compares the output signal of the supply modulator 500 fed back from the detector 550 and a desired output signal, generates calibration data, and provides the generated calibration data to the supply modulator 500 through an SPI. In an exemplary embodiment, the calibration data is provided together with a clock signal to the supply modulator 500 through the SPI.

Next, in step 1008, the supply modulator 500 converts the output signal of the supply modulator 500 fed back from the detector 550, into a digital signal. The converted digital signal can be used as the calibration data.

After that, in step 1010, the supply modulator 500 calibrates the characteristic of the supply modulator 500 using the clock signal (i.e., a calibration instruction indicator) provided from the modem 510 and the calibration data. Calibrating the characteristic of the supply modulator 500 means calibrating a parameter determining the performance of the supply modulator 500.

As described above, exemplary embodiments of the present invention calibrate the characteristics of devices or elements constructing a linear amplifying stage, which deteriorates the stability of a hybrid supply modulator, the frequency characteristic thereof, and the linearity thereof, whereby the hybrid supply modulator can maintain the stability against a variation of a few input signal magnitudes of the hybrid supply modulator, and power cells of the linear amplifying stage can be controlled depending on the input signal magnitude of the hybrid supply modulator, thereby improving efficiency and operation speed. Also, an operation characteristic of the linear amplifying stage can be insensitive to a PVT process variation, so the whole hybrid supply modulator can operate stably.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. A transmit apparatus having a supply modulator, the apparatus comprising:
    a detector for detecting an output signal of the supply modulator;
    a modulator/demodulator (modem) for receiving the detected output signal of the supply modulator from the detector and for providing a calibration signal for calibrating a modulation characteristic of the supply modulator; and
    the supply modulator for receiving the detected output signal of the supply modulator from the detector and for calibrating the modulation characteristic of the supply modulator.

2. The apparatus of claim 1, wherein the supply modulator comprises an Analog to Digital Converter (ADC) for converting the output signal of the supply modulator fed back from the detector, into a digital signal, and
    wherein the supply modulator calibrates the modulation characteristic of the supply modulator using the converted digital signal.

3. The apparatus of claim 1, further comprising a Radio Frequency (RF) power amplifier for amplifying an RF signal based on the output signal of the supply modulator.

4. The apparatus of claim 3, wherein the RF power amplifier is one of an Envelope Tracking (ET) power amplifier and an Envelope Elimination and Restoration (EER) power amplifier.

5. The apparatus of claim 1, wherein the supply modulator is a hybrid supply modulator, the hybrid supply modulator comprising:
    a linear amplifying stage for receiving an envelope signal from the modulator/demodulator (modem) and for eliminating a ripple component comprised in an output signal of a switching amplifying stage; and
    the switching amplifying stage for generating a signal for driving an RF power amplifier based on inputting of an output signal of the linear amplifying stage.

6. The apparatus of claim 5, wherein the linear amplifying stage comprises a Resistor-Capacitor (RC) compensator, the RC compensator comprising an Operational Trans-conductance Amplifier (OTA) input stage, a push-pull output stage, and a plurality of Resistor-Capacitor (RC) pairs.

7. The apparatus of claim 5, wherein the hybrid supply modulator calibrates one of a phase margin characteristic varying in accordance with a variable characteristic of an equivalent resistor of the RF power amplifier, calibrates a transistor level of a push-pull output stage, and calibrates a bias characteristic of the push-pull output stage depending on a Process Voltage Temperature (PVT) variation characteristic.

8. A transmit apparatus having a supply modulator, the apparatus comprising:
    a modulator/demodulator (modem) for providing a calibration signal according to an output signal of the supply modulator for calibrating a modulation characteristic of the supply modulator, to the supply modulator; and
    the supply modulator for outputting a modulated signal in accordance with the calibrated modulation characteristic of the supply modulator based on the calibration signal from the modem.

9. The apparatus of claim 8, wherein the calibration signal is transmitted through one of a Serial Peripheral Interface (SPI) and an Inter-Integrated Circuit (I2C) bus.

10. The apparatus of claim 8, further comprising a Radio Frequency (RF) power amplifier for amplifying an RF signal based on the output signal of the supply modulator.

11. The apparatus of claim 10, wherein the RF power amplifier is one of an Envelope Tracking (ET) power amplifier and an Envelope Elimination and Restoration (EER) power amplifier.

12. The apparatus of claim 8, wherein the modulated signal of the supply modulator is used as an input signal for driving an RF power amplifier.

13. The apparatus of claim 8, wherein the supply modulator comprises a calibration register storing the calibration signal.

14. The apparatus of claim 8, wherein the supply modulator is a hybrid supply modulator, the hybrid supply modulator comprising:
- a linear amplifying stage for receiving an envelope signal from the modem and for eliminating a ripple component comprised in an output signal of a switching amplifying stage; and
- the switching amplifying stage for generating a signal for driving an RF power amplifier based on inputting of an output signal of the linear amplifying stage.

15. The apparatus of claim 14, wherein the linear amplifying stage comprises a Resistor-Capacitor (RC) compensator, the RC compensator comprising an Operational Trans-conductance Amplifier (OTA) input stage, a push-pull output stage, and a plurality of Resistor-Capacitor (RC) pairs.

16. The apparatus of claim 14, wherein the hybrid supply modulator performs one of calibrating a phase margin characteristic varying in accordance with a variable characteristic of an equivalent resistor of the RF power amplifier, calibrating a transistor level of a push-pull output stage, and calibrating a bias characteristic of the push-pull output stage depending on a Process Voltage Temperature (PVT) variation characteristic.

17. A transmit apparatus having a supply modulator, the apparatus comprising:
- a detector for detecting an output signal of the supply modulator;
- a modulator/demodulator (modem) for receiving the detected output signal of the supply modulator from the detector, for determining a calibration signal for calibrating a modulation characteristic of the supply modulator, and for providing the calibration signal to the supply modulator; and
- the supply modulator for outputting a modulated signal according to the modulation characteristic of the supply modulator that is calibrated based on the calibration signal provided from the modem.

18. The apparatus of claim 17, wherein the supply modulator is a hybrid supply modulator, the hybrid supply modulator comprising:
- a linear amplifying stage for receiving an envelope signal from the modem and eliminating a ripple component comprised in an output signal of a switching amplifying stage; and
- the switching amplifying stage for generating a signal for driving a Radio Frequency (RF) power amplifier based on inputting of an output signal of the linear amplifying stage.

19. The apparatus of claim 18, wherein the linear amplifying stage comprises a Resistor-Capacitor (RC) compensator, the RC compensator comprising an Operational Trans-conductance Amplifier (OTA) input stage, a push-pull output stage, and a plurality of Resistor-Capacitor (RC) pairs.

20. The apparatus of claim 19, wherein the RC compensator selects at least one or more RC pairs based on a digital signal corresponding to the output signal of the supply modulator fed back from the detector, and calibrates a phase margin characteristic varying in accordance with a variable characteristic of an equivalent resistor of the RF power amplifier, and
- wherein the resistor (R) and the capacitor (C) pair being positioned between the OTA input stage and the push-pull output stage.

21. The apparatus of claim 19, wherein the push-pull output stage adjusts a transistor level of the push-pull output stage based on a digital signal corresponding to the output signal of the supply modulator fed back from the detector, and calibrates a Gain-Bandwidth product (GBW) characteristic of the push-pull output stage.

22. The apparatus of claim 21, wherein the transistor level of the push-pull output stage is adjusted by turning On/Off each of a plurality of power cells constructing the push-pull output stage based on the digital signal, each power cell being comprised of one P-type Metal-Oxide-Semiconductor (MOS) Field Effect Transistor (FET) and one N-type MOS FET.

23. The apparatus of claim 19, wherein the push-pull output stage selects a bias scheme based on 1st calibration data provided from the modem, and calibrates a bias characteristic varying in accordance with a Process Voltage Temperature (PVT) variation characteristic.

24. A method of calibrating a supply modulator of a transmitter, the method comprising:
- detecting, at a detector, an output signal of the supply modulator; and
- receiving, at a modulator/demodulator (modem), the detected output signal of the supply modulator;
- generating a calibration signal for calibrating a modulation characteristic of the supply modulator; and
- calibrating the modulation characteristic of the supply modulator.

25. The method of claim 24, further comprising:
- converting the output signal of the supply modulator detected from the detector, into a digital signal; and
- calibrating the modulation characteristic of the supply modulator using the converted digital signal.

26. The method of claim 24, wherein the supply modulator is a hybrid supply modulator, the hybrid supply modulator comprising:
- a linear amplifying stage for receiving an envelope signal from a modulator/demodulator (modem) and eliminating a ripple component comprised in an output signal of a switching amplifying stage; and
- the switching amplifying stage for generating a signal for driving a Radio Frequency (RF) power amplifier based on inputting of an output signal of the linear amplifying stage.

27. The method of claim 26, wherein the linear amplifying stage comprises a Resistor-Capacitor (RC) compensator, the RC compensator comprising an Operational Trans-conductance Amplifier (OTA) input stage, a push-pull output stage, and a plurality of Resistor-Capacitor (RC) pairs.

28. The method of claim 26, wherein the hybrid supply modulator calibrates one of a phase margin characteristic varying in accordance with a variable characteristic of an equivalent resistor of the RF power amplifier, calibrates a transistor level of a push-pull output stage, and calibrates a bias characteristic of the push-pull output stage depending on a Process Voltage Temperature (PVT) variation characteristic.

29. A method of calibrating a supply modulator of a transmitter, the method comprising:
- providing a calibration signal according to an output signal of the supply modulator for calibrating a modulation characteristic of the supply modulator, to the supply modulator;
- calibrating the modulation characteristic of the supply modulator based on the calibration signal from a modulator/demodulator (modem); and
- outputting a modulated signal in accordance with the calibrated modulation characteristic of the supply modulator.

30. The method of claim 29, wherein the calibration signal is transmitted through one of a Serial Peripheral Interface (SPI) or an Inter-Integrated Circuit (I2C) bus.

31. The method of claim 29, further comprising amplifying a Radio Frequency (RF) signal based on the output signal of the supply modulator.

32. The method of claim 29, further comprising storing the calibration signal.

33. The method of claim 29, wherein the supply modulator is a hybrid supply modulator, the hybrid supply modulator comprising:
  a linear amplifying stage for receiving an envelope signal from the modem and eliminating a ripple component comprised in an output signal of a switching amplifying stage; and
  the switching amplifying stage for generating a signal for driving an RF power amplifier based on inputting of an output signal of the linear amplifying stage.

34. The method of claim 33, wherein the linear amplifying stage comprises a Resistor-Capacitor (RC) compensator, the RC compensator comprising an Operational Trans-conductance Amplifier (OTA) input stage, a push-pull output stage, and a plurality of Resistor-Capacitor (RC) pairs.

35. The method of claim 33, wherein the hybrid supply modulator performs one of calibrating a phase margin characteristic varying in accordance with a variable characteristic of an equivalent resistor of the RF power amplifier, calibrating a transistor level of a push-pull output stage, and calibrating a bias characteristic of the push-pull output stage depending on a Process Voltage Temperature (PVT) variation characteristic.

36. A method of calibrating a supply modulator of a transmitter, the method comprising:
  detecting an output signal of the supply modulator;
  receiving the detected output signal of the supply modulator from a detector, determining a calibration signal for calibrating a modulation characteristic of the supply modulator, and providing the calibration signal to the supply modulator; and
  outputting a modulated signal according to the modulation characteristic of the supply modulator that is calibrated based on the calibration signal provided from a modulator/demodulator (modem).

37. The method of claim 36, wherein the supply modulator is a hybrid supply modulator, the hybrid supply modulator comprising:
  a linear amplifying stage for receiving an envelope signal from the modem and eliminating a ripple component comprised in an output signal of a switching amplifying stage; and
  the switching amplifying stage for generating a signal for driving a Radio Frequency (RF) power amplifier based on inputting of an output signal of the linear amplifying stage.

38. The method of claim 37, wherein the linear amplifying stage comprises a Resistor-Capacitor (RC) compensator, the RC compensator comprising an Operational Trans-conductance Amplifier (OTA) input stage, a push-pull output stage, and a plurality of Resistor-Capacitor (RC) pairs.

39. The method of claim 38, wherein the RC compensator selects at least one or more RC pairs based on a digital signal corresponding to the output signal of the supply modulator fed back from the detector, and calibrates a phase margin characteristic varying in accordance with a variable characteristic of an equivalent resistor of the RF power amplifier, and
  wherein the resistor (R) and the capacitor (C) pair being positioned between the OTA input stage and the push-pull output stage.

40. The method of claim 38, wherein the push-pull output stage adjusts a transistor level of the push-pull output stage based on a digital signal corresponding to the output signal of the supply modulator fed back from the detector, and calibrates a Gain-Bandwidth product (GBW) characteristic of the push-pull output stage.

41. The method of claim 38, wherein a transistor level of the push-pull output stage is adjusted by turning On/Off each of a plurality of power cells constructing the push-pull output stage based on a digital signal, each power cell being comprised of one P-type Metal-Oxide-Semiconductor (MOS) Field Effect Transistor (FET) and one N-type MOS FET.

42. The method of claim 38, wherein the push-pull output stage selects a bias scheme based on 1st calibration data provided from the modem, and calibrates a bias characteristic varying in accordance with a Process Voltage Temperature (PVT) variation characteristic.

\* \* \* \* \*